United States Patent
Canfield et al.

(10) Patent No.: US 7,639,511 B2
(45) Date of Patent: *Dec. 29, 2009

(54) ADJUSTABLE ATTACHMENT FOR ELECTRONIC ASSEMBLIES

(75) Inventors: Shawn M. Canfield, Poughkeepsie, NY (US); Joseph P. Corrado, Marlboro, NY (US); Michael J. Fisher, Poughkeepsie, NY (US); Udo Jourdan, Kerhonkson, NY (US); Budy D. Notohardjono, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 547 days.

This patent is subject to a terminal disclaimer.

(21) Appl. No.: 11/407,021

(22) Filed: Apr. 19, 2006

(65) Prior Publication Data
US 2007/0247818 A1    Oct. 25, 2007

(51) Int. Cl.
*H05K 7/12* (2006.01)
(52) U.S. Cl. .................. 361/807; 361/809; 361/726; 361/740; 312/223.2
(58) Field of Classification Search .............. 361/807, 361/809, 810, 726, 732, 740; 312/223.2, 312/223.3
See application file for complete search history.

(56) References Cited

U.S. PATENT DOCUMENTS

| | | | | | |
|---|---|---|---|---|---|
| 4,882,655 | A | * | 11/1989 | Pavie | 361/726 |
| 5,674,023 | A | * | 10/1997 | Williams | 403/231 |
| 6,144,562 | A | * | 11/2000 | Voelzke et al. | 361/825 |
| 6,327,147 | B1 | * | 12/2001 | Llapitan et al. | 361/704 |
| 6,353,542 | B1 | * | 3/2002 | Smith | 361/825 |

* cited by examiner

*Primary Examiner*—Dameon E Levi
(74) *Attorney, Agent, or Firm*—Geraldine Monteleone, Esq.; Kevin P. Radigan, Esq.; Heslin Rothenberg Farley & Mesiti P.C.

(57) ABSTRACT

An apparatus and method used for connecting surfaces to one another is provided. In one embodiment, the apparatus comprises of a mounting body with a front and a back portion. The front portion includes an opening that is aligned with another opening of a block, fixably attached to this front portion. The openings of the block and/or front section can include internal threading. A threaded insert is then placed inside the block such that the insert can move from a first position to a second position using threading movement.

17 Claims, 5 Drawing Sheets

ADJUSTABLE ATTACHMENT FOR ELECTRONIC ASSEMBLIES

BACKGROUND OF THE INVENTION

1. Field of the Invention

This invention relates to a method and apparatus for affixing a plurality of surfaces to one another, using an adjustable attachment and more particularly to a method and apparatus affixing surfaces in a computing environment to one another using an adjustable attachments.

2. Description of Background

Large computing system environments are often comprised of a cage like frame or rack, with a plurality of insertable nodes that are plugged into this frame. The nodes often include a variety of electronic components, such as daughter cards, processors and other such components. The frame often consists of a plurality of vertically extending supports that interconnect two or more horizontal rails. Side and rear and/or front structural surfaces can also be optionally added to enhance structural rigidity or to accommodate the thermal interface subassemblies used to cool the computing system environment.

In order to insert the nodes containing electronic components are inserted into the frame, the frame is often provided with mating interconnects that receive these nodes. After they are plugged into their mating interconnects, the nodes are then fixed, latched or mounted into a position using a number mounting devices to prevent relative movement. Operational vibration and shock as some examples, make it a necessity that these assemblies are mounted to avoid a number of issues such as potential functional problems such as intermittent due to connection wear.

The ability to rigidly attach these nodes once they are plugged or placed into their mating interconnects and final position, becomes a function of the substructures node tolerance as well as the tolerance of the frame and the ability to rigidly span that tolerance with a sufficiently rigid member. It is undesirable to design mounting apparatus that delivers loading or stresses to the interconnect system as it not only affect the structural integrity of the computing environment and may potentially even lead to performance problems. Similarly, any design that leads to unbalanced loading of the frame and substructure is also undesirable for similar reasons.

A number of solutions are provided in the prior art to provide a viable mounting apparatus. These include a variety of designs implementing springs and other elastic means as part of their incorporated solution.

However, these solutions do not always provide the necessary mounting rigidity that can make the nodes immune to vibrations and shipping shock, among other things.

One particular challenge stems from tolerance buildup. In one measured case, where experimental data was collected, the implementation of prior art led to a case where the tolerance buildup was as much as 2.2 and there was a gap between the mounting bracket (of a node) and the frame (central electronic complex—CEC) caged frame on account of this tolerance buildup. The torque value in this instance was also measured to be in the general area of 15 in/lbs. In such situations and as a result of relatively low clamping force between the node and the cage, the node can move in the direction perpendicular to the node (side to side) when subjected to shipping shock and vibration.

Consequently, it is desirable to provide to provide a design that provide a solution to the problem of proper mounting of such nodes especially in view of large insertion forces.

SUMMARY OF THE INVENTION

The shortcomings of the prior art are overcome and additional advantages are provided through the apparatus and method used for connecting surfaces to one another is provided. In one embodiment, the apparatus comprises of a mounting body with a front and a back portion. The front portion includes an opening that is aligned with another opening of a block, fixably attached to this front portion. The openings of the block and/or front section can include internal threading. A threaded insert is then placed inside the block such that the insert can move from a first position to a second position using threading movement. In alternate embodiments, a drive component can then be placed inside the insert to fixably connect the apparatus to mounting surfaces.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIGS. 4a and 4b are illustrations of a mounting body as used in one embodiment of present invention and viewed from different angles;

FIGS. 7 and 8 are illustration of an assembled apparatus as per one embodiment of the present invention and shown at different viewing angles.

DESCRIPTION OF THE INVENTION

Figure 1:
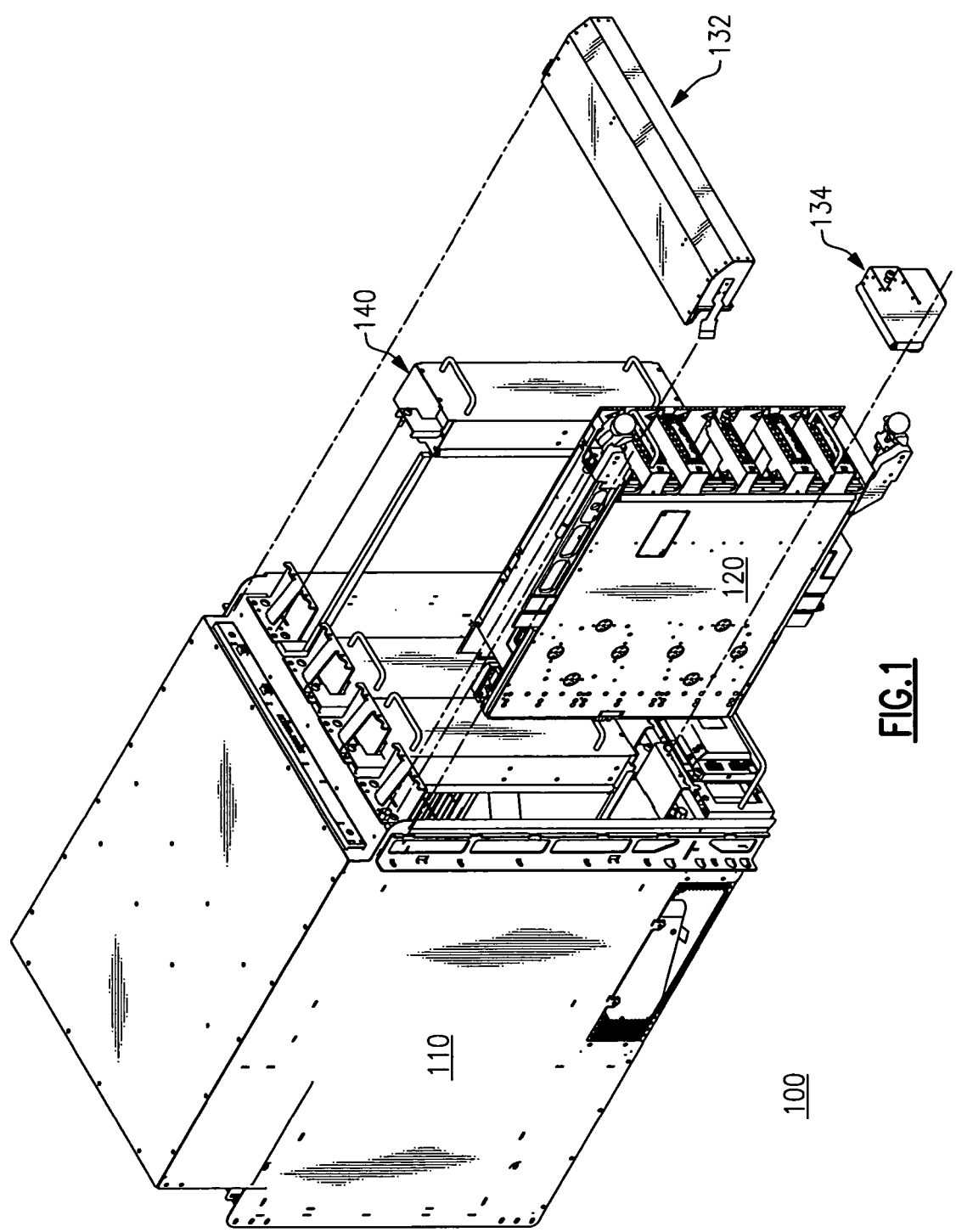
FIG. 1 is a schematic illustration of a computing system environment having a frame or housing.
Figure 2:
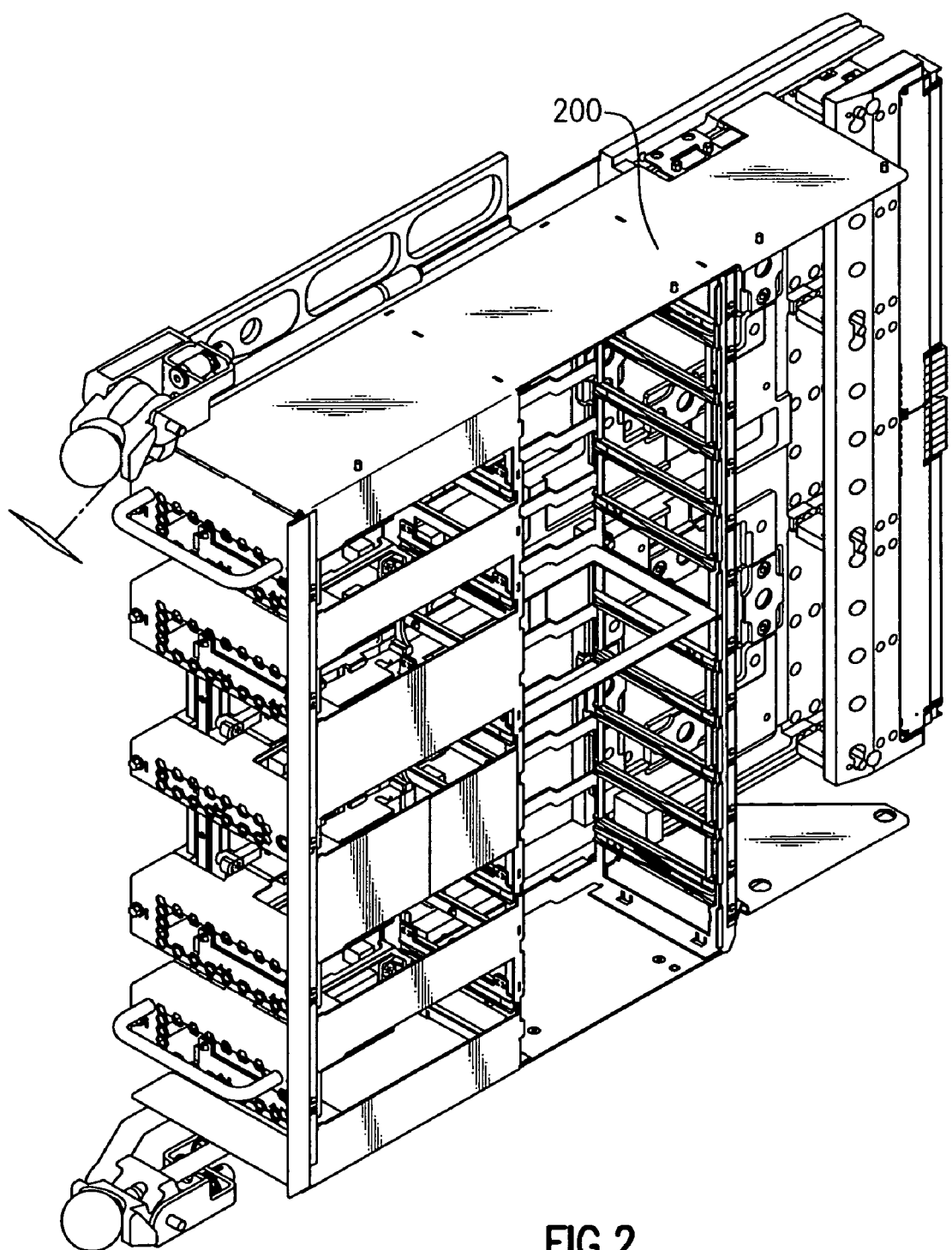
FIG. 2 is schematic illustration of a node used in the computing system of environment of FIG. 1.
Figure 3:
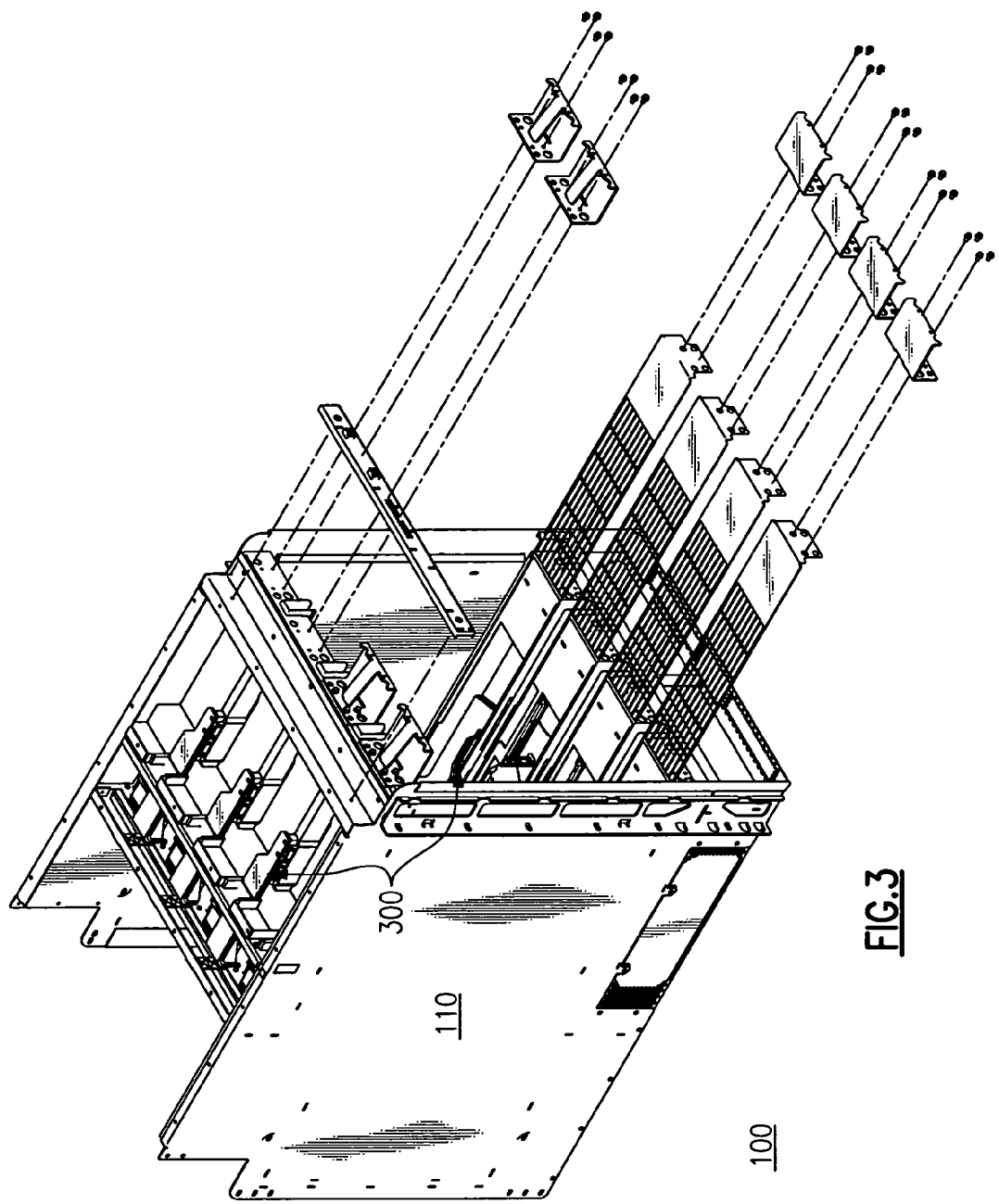
FIG. 3 is a more detailed example of a schematic illustration of the embodiment of FIG. 1 showing at least one node being inserted.

FIGS. 1 through 3 are illustrations of a large computing system frame having a plurality of nodes. The nodes may include a variety of boards and in general house electronic components. FIG. 1 is an illustration of such a computing environment. FIG. 1 provides a frontal view of a central electronic complex (CEC) 100, often included in such large computing environments.

In the illustration of FIG. 1, a housing or frame is shown as denoted by numerals 110. The frame 110 is rather cage like in structure, having a plurality of vertical supports connecting a plurality of substantially horizontal surfaces, such as top and bottom surfaces, to one another. As shown in the illustration of FIG. 1, a node 120 is shown just before being inserted into the housing 110. In the example of FIG. 1, the frame 110 is structured to support up to four nodes 120 alongside one another. While this is a common arrangement in many large servers, it is only provided as an example and other arrangements having more or less notes that are placed side by side or stacked on top of one another is conceivable. The workings of the present invention is applicable to all such embodiments and should not be limited to the illustrated example.

In addition, FIG. 1 also illustrates several other components such as such as EMC covers 132 and 134 and node fillers 140. Although illustratively provided, these components are not necessary for the present discussion and are only shown as a matter of example.

FIG. 2 provides a more detailed view of such a node 120, as was discussed in conjunction with FIG. 1. In FIG. 2, some of the boards housing the electronic components are also illustrated as referenced by numerals 200.

Looking at FIGS. 1 and 2 in conjunction with one another, the nodes 120 have to be inserted securely inside the housing frame 100 of FIG. 1. In some embodiments, mating interconnects 300 as illustrated in FIG. 3, are provided to facilitate this task. The mating interconnects 300 may be used to help guide the nodes 120 into the housing frame 110. It is not sufficient, however, just to insert the nodes 120 in the allotted slots or locations on the housing frame 110. Once assembled, the frame 110 and the inserted nodes 120 must be able to withstand vibration and shipping shocks. These forces can be great at times, leading to electrical disconnects and shorts which can cause some major problems. These problems can range from the more obvious system non-performance issues at one end of the spectrum to structural integrity issues at the other end.

One way to secure the nodes would be to provide mounting apparatus such as brackets on different surfaces of the nodes 120. The problem with this approach is multifold. For one, many mounting apparatus include plastic parts or are entirely made out of plastic. This is undesired since in many instances metal to metal contact is necessary for continued excellence in performance. Non-metal parts also suffer from structural integrity problems and may easily break or become unattached during high system vibrations.

FIGS. 4 through 7 provide an embodiment of the present invention that specially addresses this need. Before a more detailed discussion about this embodiment is made, however, it should be noted that while the present discussion concentrates specifically on the problems left unresolved by the prior art, the workings of the present invention is not limited to providing a solution to these problems. Present invention can be applied to a variety of scenarios where such design provides advantages. Similarly, the following discussion are provided by use of examples that are used in large computing environments. The use of the present invention, however, should not be limited to this field as the following examples are only provided for ease of understanding.

Referring back to FIGS. 4 through 7, an improved mounting apparatus 400 is shown from different angles. This mounting apparatus 400 as will be discussed in more detail below, is both adjustable and able to withstand large tolerance buildups. It also has the advantage of providing a perfect connection, no matter how the node is inserted. This is a great advantage in servicing situations or even during the assembly of large computing environments.

During servicing or installation of nodes 120, the nodes 120 have to be pulled out and reinserted in difficult situations. Weight of the node, height of the frame and a variety of other physical conditions make the securing of these nodes, especially after their insertion into the frame difficult in that a good metal to metal contact may not be formed due to above mentioned difficulties (inserted at slightly wrong angle etc.) One of the many advantages provided by the present invention is that the mounting apparatus of the present invention allows for such insertion difficulties and regardless of how the node 120 is inserted ensures that good mechanical and electrical contacts are established every time.

Another advantage provided by the mounting apparatus of the present invention is that not only the design is not compact but also achievable at very little cost. Delivering such maximum performance in a minimum footprint is especially advantageous in the context of computing system environments. The industry trend, in this area, has been to continuously increase the number of electronic components inside the computing system environments. At the same time there is a push to decrease the overall size of the system environment as a whole. Given the increased number of the components in a shrinking footprint, there is always an advantage to provide solutions that take these issues in consideration.

Figure 4A:
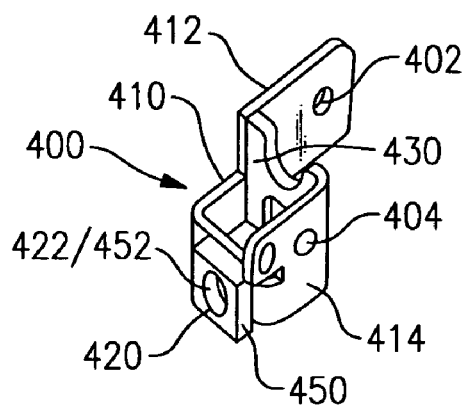
Figure 4A:
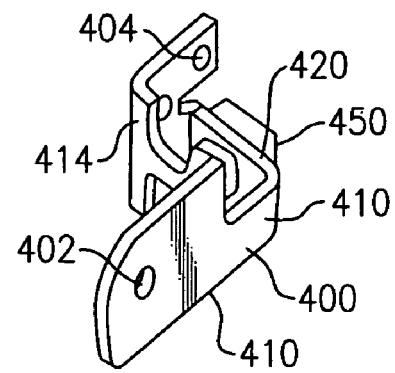

Referring back to FIGS. 4a and 4b, the mounting apparatus 400 is shown at two different angles. FIG. 4a provides a preferred embodiment where the mounting apparatus 400 is illustrated as a bracket 400. FIG. 4b provides the same bracket 400 but rotated to enable better viewing of the back section of the bracket 400.

The bracket body 410 can be of any shape. In one embodiment, brackets that are already available and cost effective can be used with added features as per the workings of the present invention to accommodate different components of the mounting apparatus 400 as will be discussed below.

In one embodiment, as provided in the illustration of FIGS. 4a and 4b, the bracket body 410 is almost cage like and comprises of a plurality of front and back sections, respectively referenced as 420 and 430 that are supported by sidewalls 412 and 414.

The front portion 420 as illustrated has an opening 422. The back section 430 can be formed in any shape. The shape of the back section 430 can be selectively changed to provide better rigidity or fixability to one or more surfaces.

Side support surfaces such as sidewalls 412 and 414 can also have alternative designs. In one embodiment as provided in FIGS. 4a and 4b, sidewall 412 is longer and extends backwards further than the back section and providing almost a tail section. Shorter sidewall 414 can extend somewhat forward, even further than the front opening 422. Both sidewall sections may comprise one or more apertures to aid the bracket's mounting to one or more surfaces subsequently. These apertures are illustrated in the example of FIGS. 4a and 4b and referenced generally by numerals 402 and 404 respectively. The mounting apparatus 400, or in this case bracket 400, is comprised in one embodiment of metal or metal compounds.

A block 450 is fixably attached to the front section 420 in front of the opening 422. The block 450 also comprises an opening 452 which aligns with the opening 422 of the block front section 420. In one embodiment of the present invention, the block 450 and its opening 452 comprise a certain thickness so as to provide threading inside this thickness (in anticipation of receiving a threaded cylinder, not illustrated here, but that will be discussed in conjunction with subsequent figures). In this embodiment, the block 450 can be herein referred to as the internal threaded block 450. The bracket's front opening 422 can also be threaded in one embodiment and aligned with the block's opening in this respect.

In a preferred embodiment, the bracket 400 and the block 450 is comprised of metal or metal compounds. In one embodiment, the block 450 is permanently affixed to the bracket 400 by means known to those skilled in the art. For example, the block 450 can be permanently welded to the bracket 400 in one embodiment.

Figure 5A:
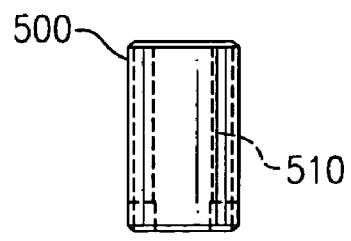
FIGS. 5a and 5b are illustration of a threaded insert to be used in conjunction with the mounting body of FIGS. 4a and 4b and shown at different viewing angles.
Figure 5B:
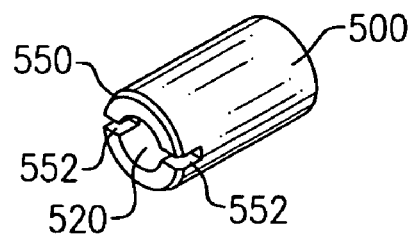

FIGS. 5a and 5b provide illustrations of an insert 500 as per one embodiment of the present invention. The insert 500 is formed to be inserted or received by block/bracket opening 422/452. In one embodiment, the insert is hollow and has external threading aligned with the treading in the openings 422/452 so that it can facilitate threading of the insert such as from a first to a second position. In a preferred embodiment, as shown in the example of FIGS. 5a and 5b, the insert is shaped as an externally threaded cylinder 500.

FIG. 5a provides a top view of the cylinder 500. The cylinder 500, in one embodiment, is also hollow inside. The external threading of the cylinder 500 that is generally illustrated in FIG. 5a by areas referenced as 510. In the embodiment where the cylinder 500 has external threading 510, the external threading of the cylinder 500 is formed such that this threading can complement the threading of the block 450.

As discussed earlier, the cylinder 510 is to be threaded (inserted) inside the aligned openings (422 and 452) of the bracket 500 and the threaded block 450 such that it can move from a first position to a second position as desired through this threading movement, and possibly in such that the length of the cylinder facing the back of the bracket (430) when inserted inside can vary according to the amount of threading.

The cylinder 500 is preferably also formed of metal and/or metal compounds in one embodiment of the present invention and can even include internal threading in some embodiments.

FIG. 5b provides an isometric cross-sectional view of the cylinder 500 of FIG. 5a. In this embodiment, as shown, the cylinder 500 comprises of a rim 510. The rim 510 can be of a certain thickness and shaped around the hollow center 520, such as to allow cuts that are subsequently used to provide dimensional tolerance. In a preferred embodiment, as illustrated in FIG. 5b, a plurality of side openings, shown as slits 552 in the figures, are cut inside the rim 550 and around the hollow center 520.

In one embodiment as illustrated, the slits 552 are cut along a diameter of the cylinder 500 as shown. There are two evenly spaced and shaped slits, generally both referenced by numerals 552. These slits are evenly spaced around the hollow center 520 along the diameter line such that an opening diameter line is produced when the slits 552 are viewed alongside the hollow center 520. In one embodiment, as illustrated in FIG. 5b, the slits 552 are formed deep into the rim 510 such that they also are of a certain thickness.

Figure 6:
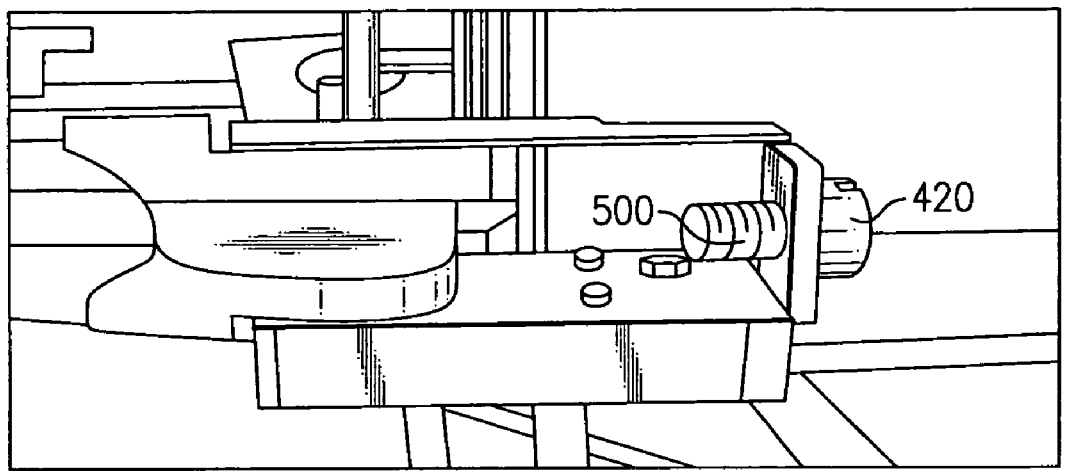
Figure 7:
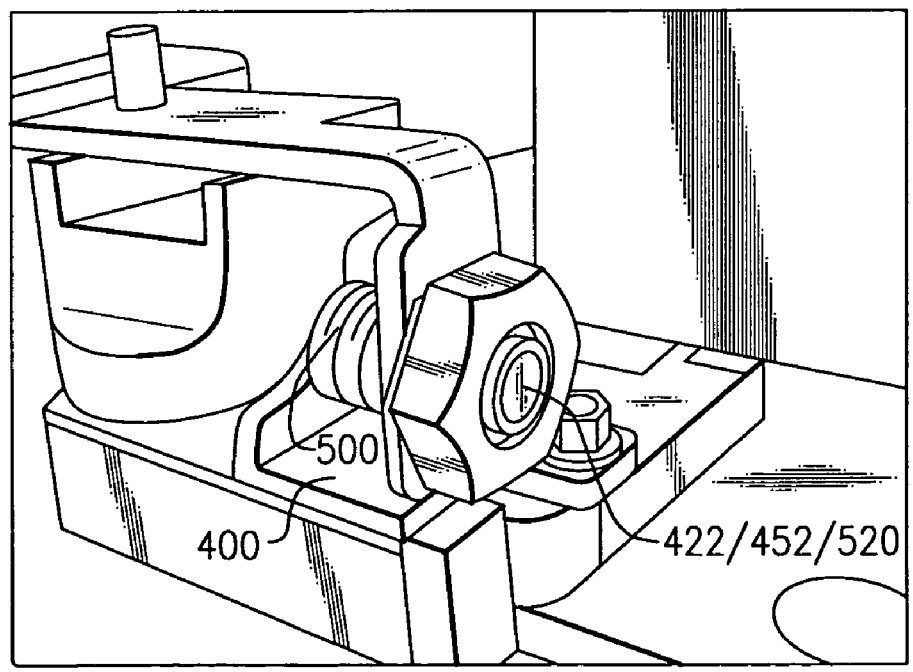

In one embodiment, as illustrated, the slits 552 are placed at least on a top or bottom side of the cylinder and when threaded will face inwards as per one embodiment of the invention (see FIGS. 6 and 7). The function of the slits 552 alongside with the hollow center 520, as will be discussed in detail later, is to allow for some movement or flotation after the bracket is fixed in its permanent position. This would lead to a three dimensional tolerance as was earlier mentioned.

FIGS. 6 and 7 each provide different views of the bracket 400 including the cylinder 500 after its insertion in the bracket 400. FIG. 6 provides a side view of the bracket 400. After being threaded inside the block 450, the threaded cylinder 500 is visible inwards in the bracket 400. It could be said that a back section of the threaded cylinder 500 is visible in this embodiment. The threads 510 are also better visible in this side view.

FIG. 7 provides an isometric view of the cylinder 500 after its insertion in block 450. In this view the hollow center of the cylinder 520 is visible through the block opening 452. Again the cylinder is shown after threaded inside the block 450. The isometric view allows not only the frontal view of the block 400 to be visible, but also the threading of the cylinder 510 is visible also visible inwards on what can be called the back section of the cylinder 500 in this view. One of the plurality of slits discussed in conjunction with the embodiment of FIG. 5b is also visible in this section and is appropriately referenced by numerals 552. As noted before, the slits 552 are placed inside the bracket and are formed on what can be considered the back section of the cylinder 500 as discussed above.

The bracket 400 can be affixed to any of the plurality of surfaces that requires affixing. Although not illustrated here (see FIG. 8 for illustration of the insertion component 800) and not part of the bracket, but an insertion component can then be inserted inside the threaded cylinder 500 that has been inserted into the block 450 to finalize affixation of the bracket. The insertion component can be comprised of a variety of such components as known to those skilled in the art. In one embodiment, the insertion component is a threaded metal screw. The length of the threaded metal screw has to be sufficiently long to pass through and provide bracket affixation to the surface.

Other drive components can be also used. In one embodiment threading to match an internal threading of the cylinder, in embodiments that includes it, can also be provided.

FIG. 8 shows a cross sectional embodiment of the present after the bracket 450 has been affixed to a surface. In FIG. 8, an already existing receiving hole such as the one provided on a computer frame is shown. The bracket can then by mounted on the node or on other surfaces, such that as shown when these plurality of surfaces are placed together, the gap can be closed providing for an adjustable solution that provides a metal to metal contact supporting high clamping forces. Once the screw 800 is inserted, the bracket as assembled also provides ease of floatation through the self positioning and self alignment provided by the slits 552 as discussed. This provides an all directional tolerance for the device as a whole.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. An apparatus comprising:
   a mounting body having a front portion with an opening;
   a block fixably attached to said mounting body front, said block also having an internally threaded opening such that said mounting body and said block's opening align when fixably attached to one another;
   an insert having external threading, inserted inside said block such that it can be moved from a first to a second position by threading it;
   wherein said threaded insert is hollow; and
   wherein said threaded insert includes one or more apertures to allow self positioning and dimensional tolerance after attachment other surfaces.

2. The apparatus of claim 1, wherein said apertures are places on a first side of said threaded insert such that when said threaded insert is disposed inside said block, said apertures face internally towards a back portion of said mounting body.

3. The apparatus of claim 2, wherein said mounting body has a plurality of vertical supports that connect said front and back portions to one another.

4. The apparatus of claim 3, wherein said threaded insert is a hollow cylinder.

5. The apparatus of claim 4, wherein said threaded insert has a rim of a certain thickness around its hollow center.

6. The apparatus of claim 5, wherein a plurality of slits are provided on said rim across said cylinder's diameter to provide for self positioning and dimensional tolerance.

7. The apparatus of claim 6, wherein said apparatus is comprised of metal or metal compounds.

8. The apparatus of claim 7, wherein a drive component is placed inside said hollow cylinder to secure said apparatus to mounting surface(s).

9. The apparatus of claim 8, wherein said drive component is also threaded.

10. The apparatus of claim 8, wherein said hollow cylinder is both internally and externally threaded to align with threading of said block and said drive component.

11. The apparatus of claim 10, wherein said drive component is a screw.

12. The apparatus of claim 11, wherein said screw is also comprised of metal or metal components.

13. The apparatus of claim 12, wherein said slits are provided on a first side of said cylinder such that when said cylinder is inserted in said block, said slits face internally toward said back of said apparatus body.

14. The apparatus of claim 13, wherein said apparatus is used to fixably attach a node to a housing frame in a computing system environment.

15. The apparatus of claim 14, wherein said apparatus body is further comprised of a bracket.

16. An apparatus for fixably connect a first surface to a second surface comprising:
   a bracket having a back and a front section connected to one another by a plurality of side section supports and said front section having an opening;
   a block having an internally threaded opening fixably connected to said front section of said bracket such that said internally threaded opening of said block aligns with said bracket's opening;
   a hollow cylinder having external threading aligned with said bracket's opening threaded inside said block's opening such that said cylinder can be moved from a first to a second position using threading motion;
   said hollow cylinder having a rim around said hollow center with a plurality of slits formed on a diameter line of said cylinder disposed at least on a top or bottom surface such that when said cylinder is inserted in said block, said slits face said back section of said bracket;
   a driving screw capable of being inserted inside said bracket formed to fixably attach said bracket including said block and said threaded cylinder to mounting surfaces.

17. A mounting method comprising:
   forming a mounting body having a front and a back section, said front section having an opening;
   fixably connecting a block having an internally threaded opening to said front section of said mounting body such that said opening of said block and said mounting body align;
   threading a hollow cylinder with external threading inside said block's internal threaded opening such that a plurality of slits cut across a diameter of said cylinder's rim face internally towards said back section of said mounting body;
   inserting a drive component inside said hollow cylinder to affix said bracket including said block and said cylinder to mounting surfaces.

\* \* \* \* \*